(12) United States Patent
Jang

(10) Patent No.: US 10,256,424 B2
(45) Date of Patent: Apr. 9, 2019

(54) FLEXIBLE SUBSTRATE, METHOD OF MANUFACTURING THE SAME, AND DISPLAY APPARATUS EMPLOYING THE SAME

(71) Applicant: SAMSUNG DISPLAY CO., LTD., Yongin-si, Gyeonggi-do (KR)

(72) Inventor: Cheol Jang, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/481,043

(22) Filed: Apr. 6, 2017

(65) Prior Publication Data
US 2018/0047920 A1 Feb. 15, 2018

(30) Foreign Application Priority Data
Aug. 11, 2016 (KR) .................. 10-2016-0102439

(51) Int. Cl.
*H01L 29/08* (2006.01)
*H01L 51/00* (2006.01)
(Continued)

(52) U.S. Cl.
CPC .......... *H01L 51/0097* (2013.01); *B32B 5/145* (2013.01); *B32B 27/08* (2013.01); *H01L 27/323* (2013.01); *H01L 27/3244* (2013.01); *H01L 51/5253* (2013.01); *H01L 51/56* (2013.01); *B32B 2457/206* (2013.01);
(Continued)

(58) Field of Classification Search
CPC ............. H01L 2251/10; H01L 2251/30; H01L 2251/301; H01L 2251/5338; H01L 51/0097; H01L 23/4985; H01L 27/1218; H01L 27/28; G02F 1/133305; G02F 1/355; G02F 1/361; B32B 2457/206
See application file for complete search history.

(56) References Cited

U.S. PATENT DOCUMENTS 7,298,072 B2 * 11/2007 Czeremuszkin .... H01L 51/5256
313/292
9,647,052 B2 * 5/2017 Youn .................... H01L 27/3276
(Continued)

FOREIGN PATENT DOCUMENTS

JP 2015-103389 6/2015
KR 10-2004-0094200 11/2004
(Continued)

OTHER PUBLICATIONS

European Search Report in co-pending European Application No. 17185804.6 dated Feb. 12, 2018 (9 pages).

*Primary Examiner* — Hsien Ming Lee
(74) *Attorney, Agent, or Firm* — F. Chau & Associates, LLC

(57) ABSTRACT

A flexible substrate includes a polymer substrate. At least a portion of a first barrier region is formed on a neutral plane of the polymer substrate. A top region is formed above the first barrier region. A bottom region is formed below the first barrier region. The first barrier region includes a first inorganic material disposed in at least a portion of a free volume of the polymer substrate. A density of the first inorganic material in the first barrier region is greater than a density of the first inorganic material in the top or bottom regions.

18 Claims, 10 Drawing Sheets

(51) Int. Cl.
  *B32B 5/14* (2006.01)
  *B32B 27/08* (2006.01)
  *H01L 27/32* (2006.01)
  *H01L 51/52* (2006.01)
  *H01L 51/56* (2006.01)

(52) U.S. Cl.
  CPC ............... *H01L 2251/301* (2013.01); *H01L 2251/5338* (2013.01); *H01L 2251/558* (2013.01)

(56) References Cited

U.S. PATENT DOCUMENTS

| | | |
|---|---|---|
| 2004/0174115 A1 | 9/2004 | Czeremuszkin et al. |
| 2007/0275181 A1 | 11/2007 | Carcia et al. |
| 2012/0032355 A1 | 2/2012 | Wang et al. |
| 2016/0164026 A1 | 6/2016 | Kim et al. |

FOREIGN PATENT DOCUMENTS

| | | |
|---|---|---|
| KR | 10-2012-0094874 | 8/2012 |
| KR | 10-2013-0081313 | 7/2013 |
| KR | 10-2016-0069073 | 6/2016 |

\* cited by examiner

FLEXIBLE SUBSTRATE, METHOD OF MANUFACTURING THE SAME, AND DISPLAY APPARATUS EMPLOYING THE SAME

CROSS-REFERENCE TO RELATED APPLICATION

This application claims priority under 35 U.S.C. § 119 to Korean Patent Application No. 10-2016-0102439, filed on Aug. 11, 2016, in the Korean Intellectual Property Office, the disclosure of which is incorporated by reference herein in its entirety.

1. Technical Field

Exemplary embodiments of the present invention relate to a flexible substrate, and more particularly to a method of manufacturing the flexible substrate, and a display apparatus employing the flexible substrate.

2. Discussion of Related Art

A display apparatus may display visual data. The display apparatus may include a substrate including a display area and a non-display area. In the display area, a gate line and a data line may be electrically separated from each other and intersections between the gate lines and the data lines may define a plurality of pixel areas in the display area. In the display area, a thin film transistor and a pixel electrode electrically connected thereto may be connected to respective pixel areas. In the non-display area, various conductive layers such as wires transmitting electrical signals to the display area may be positioned.

A flexible display apparatus may include a bent portion or a reduced area of a foldable non-display area. The flexible display apparatus may include a flexible substrate including one or more polymer organic materials having relatively high mechanical flexibility and thermal resistance.

SUMMARY

One or more exemplary embodiments of the present invention provide a flexible substrate. The flexible substrate may be capable of reducing or preventing an infiltration of outside air. One or more exemplary embodiments of the present invention provide a method of manufacturing the flexible substrate, and a display apparatus employing the flexible substrate.

According to an exemplary embodiment of the present invention, a flexible substrate includes a polymer substrate. At least a portion of a first barrier region is formed on a neutral plane of the polymer substrate. A top region is formed above the first barrier region. A bottom region is formed below the first barrier region. The first barrier region includes a first inorganic material disposed in at least a portion of a free volume of the polymer substrate. A density of the first inorganic material in the first barrier region is greater than a density of the first inorganic material in the top or bottom regions.

According to an exemplary embodiment of the present invention, the density of the first inorganic material in the first barrier region may gradually decrease from a center thickness of the first barrier region toward upper and lower surfaces of the polymer substrate.

According to an exemplary embodiment of the present invention, the first inorganic material may include at least one of silicon nitride, aluminum nitride, zirconium nitride, titanium nitride, hafnium nitride, tantalum nitride, silicon oxide, aluminum oxide, titanium oxide, tin oxide, serium oxide, or silicon oxynitride (SiON).

According to an exemplary embodiment of the present invention, the first inorganic material of the first barrier region may fill from about 0.1% to about 50% of a free volume of the first barrier region, and an average thickness of the first barrier region may be equal to or less than from about 5% to about 50% of a thickness of the polymer substrate.

According to an exemplary embodiment of the present invention, a position of a basic core of the first barrier region need not coincide with a position of the neutral plane.

According to an exemplary embodiment of the present invention, a thickness of the polymer substrate may be from about 10 μm to about 100 μm, and an average thickness of the first barrier region may be from about 50 nm to about 50 μm.

According to an exemplary embodiment of the present invention, the flexible substrate may include a second barrier region in at least one of the top and bottom regions. The second barrier region includes a second inorganic material disposed in at least a portion of the free volume of the polymer substrate and a volume of the second barrier region may be less than the volume of the first barrier region.

According to an exemplary embodiment of the present invention, the second inorganic material may be the same as the first inorganic material.

According to an exemplary embodiment of the present invention, a hardness of the first barrier region is greater than a hardness of the top and bottom regions.

According to an exemplary embodiment of the present invention, a method of manufacturing a flexible substrate includes injecting a first reactant above a polymer substrate into a top surface of the polymer substrate and infiltrating the first reactant into the polymer substrate. The method includes injecting a second reactant below the polymer substrate into a bottom surface of the polymer substrate and infiltrating the second reactant into the polymer substrate. The method includes forming a barrier region by filling at least a portion of a free volume of the polymer substrate with an inorganic material formed via a reaction of the first and second reactants inside the polymer substrate.

According to an exemplary embodiment of the present invention, the method may includes, after forming the barrier region, identifying whether at least one of the first and second reactants has penetrated into the polymer substrate.

According to an exemplary embodiment of the present invention, in the infiltrating of the first reactant, a pressure above the polymer substrate may be greater than a pressure below the polymer substrate.

According to an exemplary embodiment of the present invention, in the infiltrating of the second reactant, a pressure above the polymer substrate may be less than a pressure below the polymer substrate.

According to an exemplary embodiment of the present invention, the infiltrating of the first reactant and the infiltrating of the second reactant may be sequentially performed.

According to an exemplary embodiment of the present invention, the first reactant may be one of water ($H_2O$), ozone ($O_3$), or ammonia ($NH_3$).

According to an exemplary embodiment of the present invention, the inorganic material formed via the reaction of the first and second reactants may include at least one of silicon nitride, aluminum nitride, zirconium nitride, titanium nitride, hafnium nitride, tantalum nitride, silicon oxide, aluminum oxide, titanium oxide, tin oxide, serium oxide, or SiON.

According to an exemplary embodiment of the present invention, at least a portion of the barrier region may be placed on a neutral plane of the polymer substrate.

According to an exemplary embodiment of the present invention a manufacturing apparatus may be configured to manufacture the flexible substrate. The apparatus may include a first serve chamber and a second serve chamber. The polymer substrate may be disposed between side walls of the first and second serve chambers. The polymer substrate may form an airtight seal in the first and second chambers. The first serve chamber may include a first gas supplier configured to supply the first reactant, a first residual gas analyzer, and a first temperature controller, and the second serve chamber may include a second gas supplier configured to supply the second reactant, a second residual gas analyzer, and a second temperature controller.

According to an exemplary embodiment of the present invention, a method of manufacturing a flexible substrate includes infiltrating a first reactant into substantially an entire polymer substrate; and removing the first reactant infiltrated into a top region in the polymer substrate. The method includes infiltrating a second reactant into at least a portion of the polymer substrate; and forming a barrier region by filling at least a portion of a free volume of the polymer substrate with an inorganic material formed via a reaction of the first and second reactants inside the polymer substrate.

According to an exemplary embodiment of the present invention, the infiltrating of the first reactant may be performed after the polymer substrate was placed in an oven including the first reactant.

According to an exemplary embodiment of the present invention, the removing of the first reactant may be performed by applying heat to a top surface of the polymer substrate and diffusing the first reactant to outside the polymer substrate.

According to an exemplary embodiment of the present invention, the infiltrating of the second reactant may be performed inside a vacuum chamber device.

According to an exemplary embodiment of the present invention, the first reactant is one of $H_2O$, $O_3$, or $NH_3$.

According to an exemplary embodiment of the present invention, the inorganic material formed via the reaction of the first and second reactants may include at least one of silicon nitride, aluminum nitride, zirconium nitride, titanium nitride, hafnium nitride, tantalum nitride, silicon oxide, aluminum oxide, titanium oxide, tin oxide, serium oxide, or SiON.

According to an exemplary embodiment of the present invention, at least a portion of the barrier region may be placed on a neutral plane of the polymer substrate.

According to an exemplary embodiment of the present invention, after the forming of the barrier regions, identifying may be further included whether at least one of the first and second reactants penetrated through the polymer substrate.

According to an exemplary embodiment of the present invention, a display apparatus includes a flexible substrate including a display area and a non-display area. A display device is in the display area and a thin film transistor is connected to the display device. An encapsulation layer is configured to encapsulate the display area. The flexible substrate includes a polymer substrate and a first barrier region. At least a portion of the first barrier region is formed on a neutral plane of the polymer substrate. A top region is formed above the first barrier region, and a bottom region is formed below the first barrier region. The first barrier region includes a first inorganic material disposed in at least a portion of a free volume of the polymer substrate. A density of the first inorganic material in the first barrier region is greater than a density of the first inorganic material in the top or bottom regions.

According to an exemplary embodiment of the present invention, the non-display area of the flexible substrate may include a bending area bent around a bending axis. The display apparatus may include a fan-out wire with at least a portion of the fan-out wire in the bending area. The display apparatus may include an organic material layer with at least a portion or the organic material layer between the fan-out wire and the flexible substrate in the bending area.

According to an exemplary embodiment of the present invention, the display apparatus may include an inorganic insulating layer on the flexible substrate, the inorganic insulating layer having an opening corresponding to the bending area. The organic material layer may fill at least a portion of the opening.

According to an exemplary embodiment of the present invention, the display device may be an organic light-emitting diode including a pixel electrode, a counter electrode facing the pixel electrode, and an intermediate layer including an organic light-emitting layer between the pixel electrode and the counter electrode.

According to an exemplary embodiment of the present invention, a density of the first inorganic material in the first barrier region gradually may decrease from a center thickness of the first barrier region toward upper and lower ends of the flexible substrate.

According to an exemplary embodiment of the present invention, a thickness of the top region may be different from a thickness of the bottom region.

According to an exemplary embodiment of the present invention, the display apparatus may include a second barrier region in at least one of the top and bottom regions. The second barrier region includes a second inorganic material disposed in at least a portion of the free volume of the polymer substrate. A volume of the second barrier region may be less than a volume of the first barrier region.

BRIEF DESCRIPTION OF THE DRAWINGS

The above and other features of the present invention will become more apparent by describing in detail exemplary embodiments thereof, with reference to the accompanying drawings, in which.

DETAILED DESCRIPTION

Figure 1:
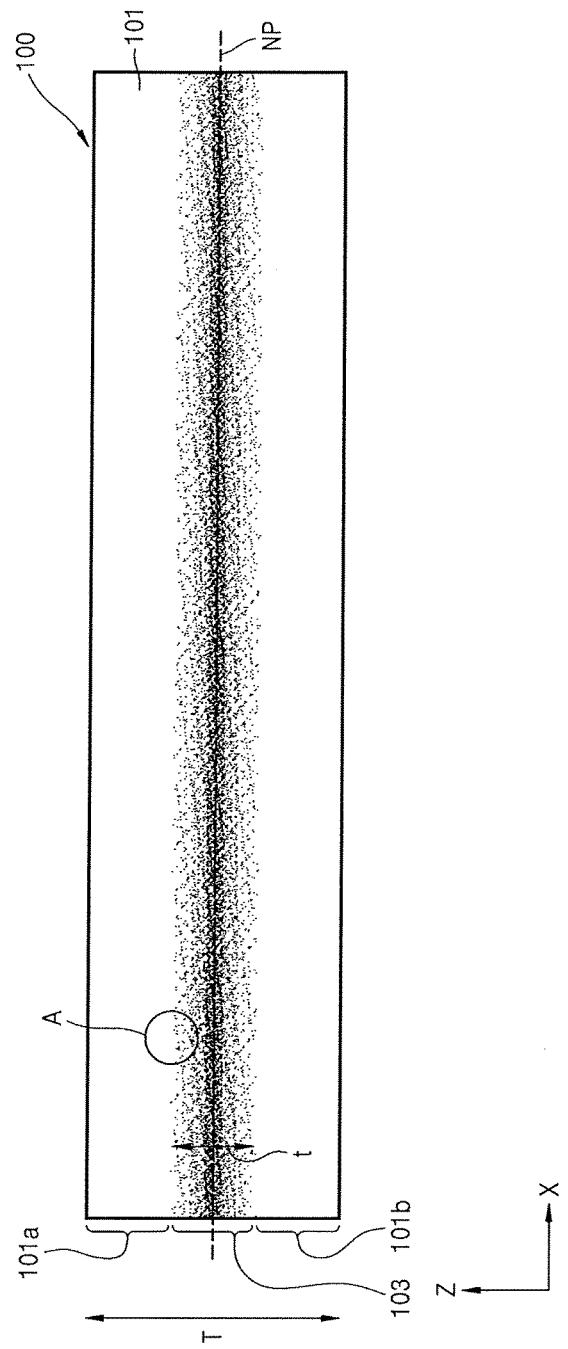
FIG. 1 is a cross-sectional view of a flexible substrate according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein.

Like reference numerals may refer to like elements throughout the specification and drawings. It will be understood that although the terms "first" and "second" may be used herein to describe various components, these components should not be limited by these terms. Sizes of elements in the drawings may be exaggerated for clarity of description.

Sizes of elements in the drawings may be exaggerated for clarity of description.

According to some exemplary embodiments of the present invention, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When an exemplary embodiment of the present invention may be implemented differently, a specific process order may be performed differently from the described order.

Figure 2:
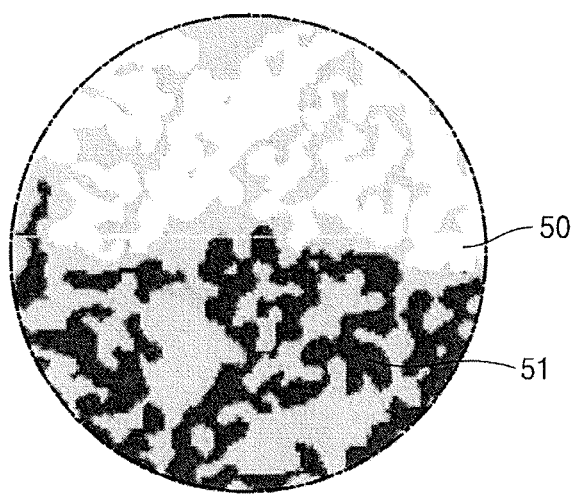
FIG. 2 is an enlarged view of a portion A in FIG. 1.
Figure 3:
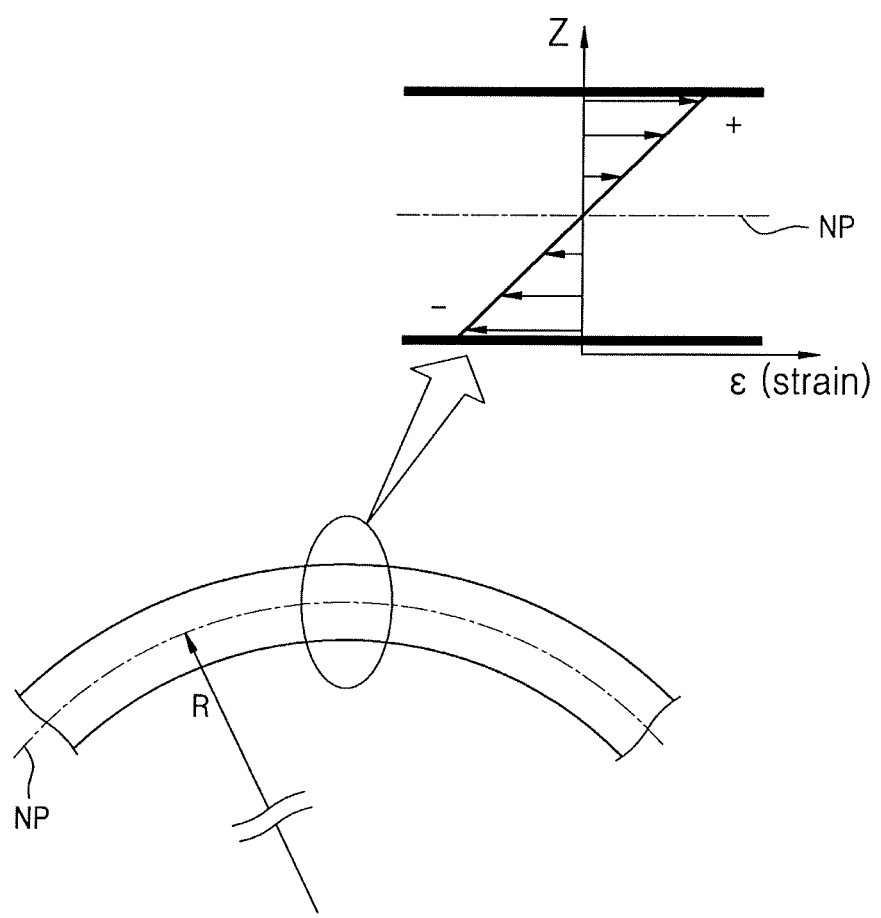
FIG. 3 is a diagram illustrating a neutral plane and strain during bending.

FIG. 1 is a cross-sectional view of a flexible substrate according to an exemplary embodiment of the present invention. FIG. 2 is an enlarged view of a portion A in FIG. 1. FIG. 3 is a diagram illustrating a neutral plane and strain during bending.

Referring to FIGS. 1 through 3, a flexible substrate 100 according to an exemplary embodiment of the present invention may include a polymer substrate 101. A first barrier region 103 with at least a portion thereof may be on a neutral plane NP of the polymer substrate 101. A top region 101a of the polymer substrate 101 may be above the first barrier region 103, and a bottom region 101b of the polymer substrate 101 may be below the first barrier region 103.

The first barrier region 103 may include a first inorganic material 51 filling at least a portion of a free volume of the polymer substrate 101. A density of the first inorganic material 51 of the first barrier region 103 may be greater than that of the first inorganic material 51 of the top region 101a and/or the bottom region 101b. The first inorganic material 51 need not be included in the top region 101a and/or the bottom region 101b, and even when the first inorganic material 51 is included in the top region 101a and/or the bottom region 101b, an amount of the first inorganic material 51 included in the top region 101a and/or the bottom region 101b may be less than that of the first inorganic material 51 included in the first barrier region 103.

As an example, the flexible substrate 100 may include the first inorganic material 51 filling a free volume 50 of the polymer substrate 101, and the density of the first inorganic material 51 may be greater near the neutral plane NP than near upper and lower surfaces of the polymer substrate 101.

The polymer substrate 101 may include one or more polymer materials having a flexible or bendable property. According to an exemplary embodiment of the present invention, the polymer substrate 101 may include at least one polymer organic material, such as acrylate resin, methacrylate resin, polyisoprene, vinyl resin, urethane resin, cellulosic resin, or perylene resin. As an example, the polymer substrate 101 may include, for example, polymer resin such as polyethersulphone (PES), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), or cellulose acetate propionate (CAP).

The polymer substrate 101 may include polymer chains and the free volume 50, which may be a space not occupied by polymer molecules between polymer chains. As an example, the free volume 50 may refer to a substantially empty space formed between polymer chains.

The polymer substrate 101 may be more flexible as a volume of the free volume 50 becomes larger. However, the free volume 50 may be a path through which moisture or oxygen from the outside may infiltrate. In an exemplary embodiment of the present invention, the first inorganic material 51 with a relatively high concentration may be formed in the first barrier region 103. Thus, an overall flexibility of the flexible substrate 100 may be secured while an occurrence of moisture or oxygen passing through the flexible substrate 100 is reduced or prevented.

The first inorganic material 51 may substantially fill the free volume 50 of the polymer substrate 101 and thus block the path through which moisture or oxygen from the outside infiltrates into the free volume 50.

When first barrier region 103 includes relatively more of the first inorganic material 51 than the top and bottom regions 101a and 101b, the first barrier region 103 may have a relatively higher hardness than that of the top region 101a and the bottom region 101b. When the first inorganic material 51 is substantially uniformly positioned throughout the entire area of the polymer substrate 101, an overall hardness of the flexible substrate 100 may increase due to the first inorganic material 51, and thus, the flexibility of the flexible substrate 100 may be reduced.

Thus, forming the first barrier region 103 to have a relatively small thickness may increase a flexibility of the flexible substrate 100. When the first inorganic material 51 fills a portion of the free volume 50 of the first barrier region 103, the path of moisture or gas (e.g., oxygen) may be blocked. According to an exemplary embodiment of the present invention, the first inorganic material 51 of the first barrier region 103 may fill from about 0.1% to about 50% of the free volume 50 of the first barrier region 103, and an average thickness t of the first barrier region 103 may be from about 5% to about 50% of a thickness T of the flexible substrate 100. According to an exemplary embodiment of the present invention, the thickness t of the first barrier region 103 may be less than a thickness of the top region 101a or the bottom region 101b.

According to an exemplary embodiment of the present invention, the thickness T of the flexible substrate 100 may be from about 10 μm to about 100 μm. According to an exemplary embodiment of the present invention, the thickness t of the first barrier region 103 may be from about 50 nm to about 50 μm.

The first barrier region 103 may have at least a portion thereof in the neutral plane NP of the polymer substrate 101. Thus, an occurrence of a crack in the first barrier region 103 when the flexible substrate 100 bends may be reduced or prevented.

According to an exemplary embodiment of the present invention, the neutral plane NP may refer to a surface formed inside an object when the object is being bent, the object neither stretching nor shrinking along this surface so that the original length of the object remains substantially constant. As an example, the neutral plane NP may refer to a surface not affected by elongation or compression, and thus, the strain thereof may be zero. Thus, when the first barrier region 103 is formed on the neutral plane NP, little or no strain might occur at a time of bending the flexible substrate 100, and a probability of a crack occurrence in the first inorganic material 51 filling the free volume 50 may be reduced or eliminated. However, strain due to bending may increase toward a surface of the object, and when an inorganic material with a relatively high hardness is positioned on the surface of the object, the probability of the crack occurrence may increase at the time of bending.

In an exemplary embodiment of the present invention, at least a portion of the first barrier region 103 may be on the neutral plane NP of the polymer substrate 101. The first barrier region 103 may be on the neutral plane NP, but a basic core Bc of the first barrier region 103 along a direction of the thickness t need not coincide with the neutral plane NP. As an example, a thickness of the top region 101a and a thickness of the bottom region 101b may be different from each other.

In an exemplary embodiment of the present invention, the first barrier region 103 may be separated from upper and lower surfaces of the polymer substrate 101. At least a portion of the first barrier region 103 may be on the neutral plane NP of the polymer substrate 101. Thus, the flexibility of the flexible substrate 100 may be secured and the path for infiltration from the outside air may be blocked by preventing or reducing the crack occurrence in the first barrier region 103.

According to an exemplary embodiment of the present invention, the density of the first barrier region 103 may be relatively highest in the basic core Bc of the thickness T of the first barrier region 103 and may gradually decrease along directions toward upper and lower surfaces of the flexible substrate 100. In a method of manufacturing the first barrier region 103 according to an exemplary embodiment of the present invention, a reaction of reactants forming the first inorganic material 51 may occur at a relatively high rate in the basic core Bc of the thickness t of the first barrier region 103.

The first inorganic material may include at least one of silicon nitride, aluminum nitride, zirconium nitride, titanium nitride, hafnium nitride, tantalum nitride, silicon oxide, aluminum oxide, titanium oxide, tin oxide, serium oxide, or silicon oxynitride (SiON).

Figure 4:
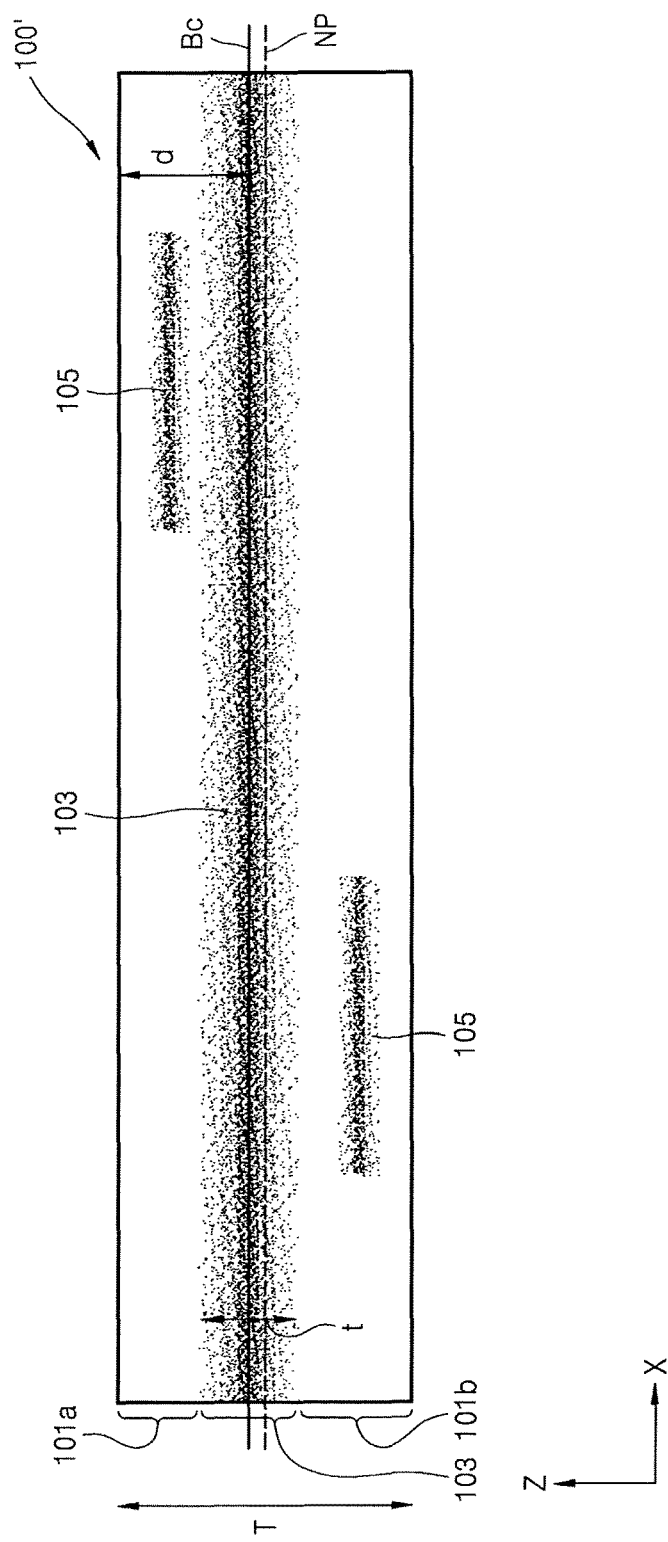
FIG. 4 is a cross-sectional view of a flexible substrate according to an exemplary embodiment of the present invention.

FIG. 4 is a cross-sectional view of a flexible substrate according to an exemplary embodiment of the present invention. Like reference numbers denote like components in FIG. 4, as in FIG. 1, and duplicate descriptions will be omitted for the sake of simplicity.

Referring to FIG. 4, a flexible substrate 100' may include the polymer substrate 101 and the first barrier region 103 with a portion thereof on the neutral plane NP of the polymer substrate 101. The first barrier region 103 may include the first inorganic material 51 filling at least a portion of the free volume 50 of the polymer substrate 101. The density of the first inorganic material 51 included in the first barrier region 103 may be relatively higher than that of the first inorganic material 51 included in the top and bottom regions 101a and 101b.

The flexible substrate 100' may include a second barrier region 105 in at least one of the top region 101a and the bottom region 101b in addition to the first barrier region 103. The second barrier region 105 may include a second inorganic material filling at least a portion of a free volume of the second barrier region 105. A volume of the second barrier region 105 may be less than that of the first barrier region 103.

The second barrier region 105 may be separated from the first barrier region 103 and may be formed when the first barrier region 103 is formed. However, exemplary embodiments of the present invention are not limited thereto. The second barrier region 105 may be formed via a separate process after the first barrier region 103 has been formed.

The second barrier region 105 may be formed relatively closer to upper and lower surfaces of the polymer substrate 101 with respect to the first barrier region 103. The second inorganic material included in the second barrier region 105 may have a higher risk of the crack occurrence than the first inorganic material 51 of the first barrier region 103 at the time of bending the flexible substrate 100'. However, even when the crack may occur in the second barrier region 105, the flexible substrate 100' may have an infiltration path of outside air that is blocked by the first barrier region 103.

The second inorganic material may include the same material or materials as the first inorganic material 51 included in the first barrier region 103, or the second inorganic material may include at least one material that is different from the first inorganic material 51.

The second inorganic material may include at least one of silicon nitride, aluminum nitride, zirconium nitride, titanium nitride, hafnium nitride, tantalum nitride, silicon oxide, aluminum oxide, titanium oxide, tin oxide, serium oxide, or SiON.

At least a portion of the first barrier region 103 may be on the neutral plane NP of the polymer substrate 101. The first barrier region 103 may be on the neutral plane NP, but the basic core Bc along a thickness direction of the first barrier region 103 need not coincide with the neutral plane NP. As an example, a thickness of the top region 101a may be different from that of the bottom region 101b. Depth of the basic core Bc from a surface of the polymer substrate 101 may be from about 5 μm to about 50 μm.

The flexible substrates 100 and 100' according to an exemplary embodiment of the present invention may include the first barrier region 103 with at least a portion thereof on the neutral plane NP of the polymer substrate 101, and thus, the infiltration path of the outside air may be blocked while the flexibility of the flexible substrates 100 and 100' may be maintained.

Figure 5:
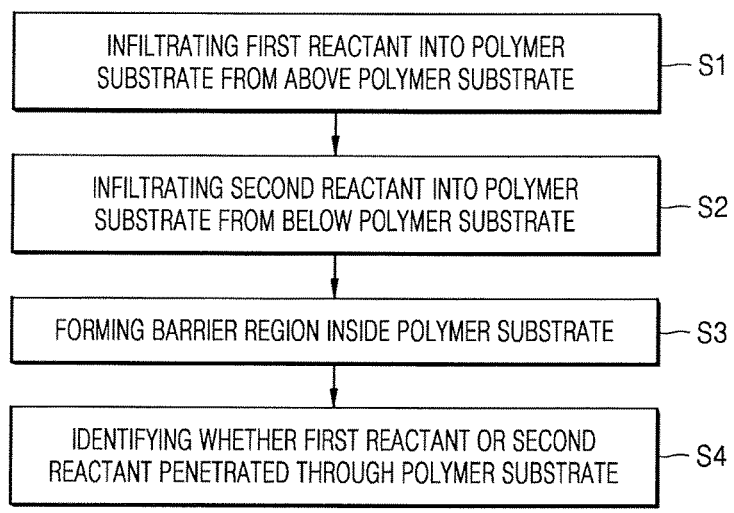
FIG. 5 is a flowchart of a method of manufacturing a flexible substrate according to an exemplary embodiment of the present invention.
Figure 6:
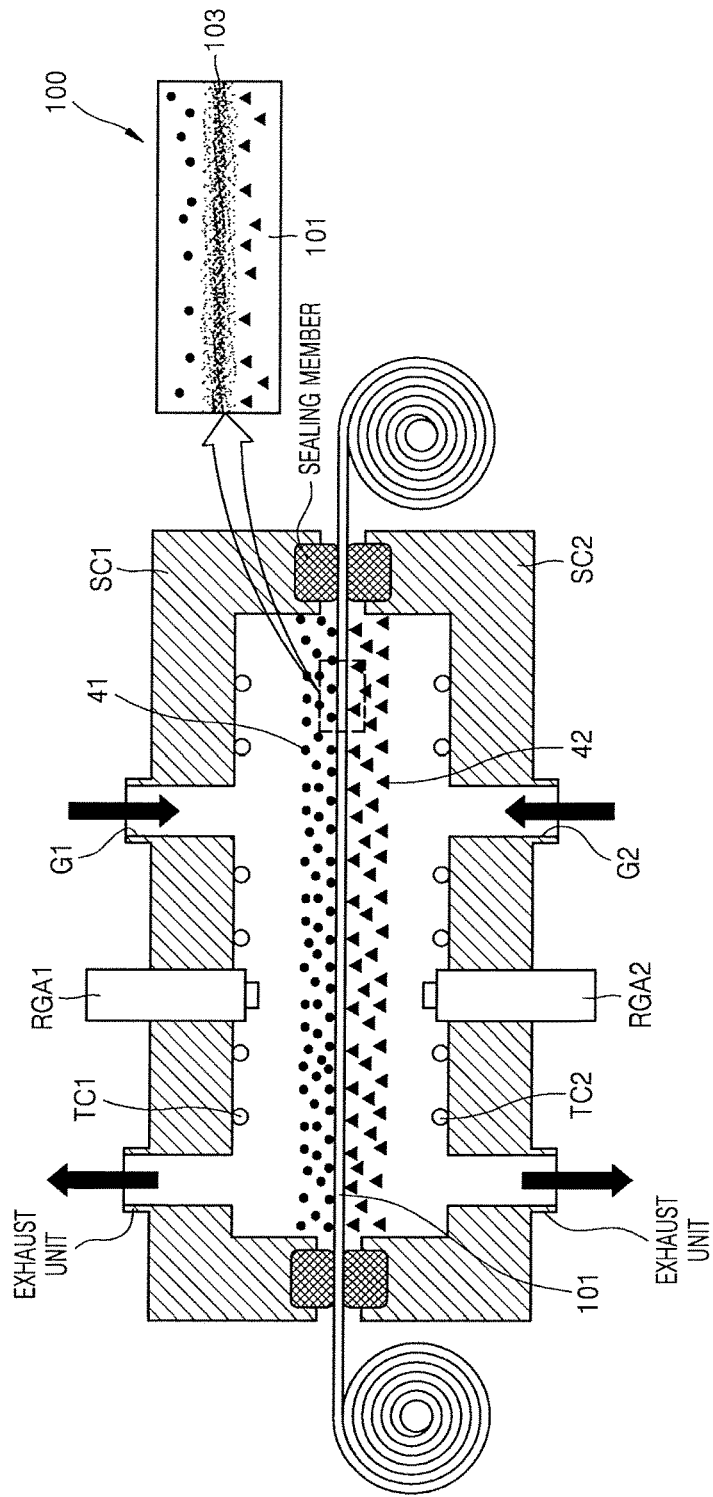
FIG. 6 is a cross-sectional view of a manufacturing device for implementing the method of manufacturing of FIG. 5.

FIG. 5 is a flowchart of a method of manufacturing a flexible substrate according to an exemplary embodiment of the present invention. FIG. 6 is a cross-sectional view of a manufacturing apparatus using the method of manufacturing of FIG. 5.

Referring to FIGS. 5 and 6, the method of manufacturing the flexible substrates 100 and 100' may include infiltrating a first reactant 41 into the polymer substrate 101 from above the top surface of the polymer substrate 101 (S1). The method of manufacturing the flexible substrates 100 and 100' may include infiltrating a second reactant 42 into the polymer substrate 101 from below the bottom surface of the polymer substrate 101 (S2). The method of manufacturing the flexible substrates 100 and 100' may include forming a barrier region (e.g., the first barrier region 103) inside the polymer substrate 101. The barrier regions may fill the free volume of the polymer substrate 101 with the first inorganic material 51 formed via a reaction between the first reactant 41 and the second reactant 42 (S3). The method of manufacturing the flexible substrates 100 and 100' may include identifying whether either the first reactant 41 or the second reactant 42 has penetrated through the polymer substrate 101 (S4).

Referring to FIG. 6, the manufacturing apparatus according to an exemplary embodiment of the present invention may include a first serve chamber SC1 and a second serve chamber SC2. The polymer substrate 101 may be disposed between the first serve chamber SC1 and the second serve chamber SC2. The polymer substrate 101 may form an airtight seal in each of the first serve chamber SC1 and the second serve chamber SC2. The first serve chamber SC1 may be a chamber configured to supply the first reactant 41 to the polymer substrate 101 through a first gas supplier G1. The second serve chamber SC2 may be a chamber configured to supply the second reactant 42 to the polymer substrate 101 through a second gas supplier G2.

The first and second serve chambers SC1 and SC2 may be vacuum chambers, and pressure inside the first and second serve chambers SC1 and SC2 may be lowered to equal to or less than about $10^{-6}$ Torr.

The first and second serve chambers SC1 and SC2 may respectively include a first temperature controller TC1 and a second temperature controller TC2. The first and second temperature controllers TC1 and TC2 may be hot wire type temperature controllers. The first and second temperature controllers TC1 and TC2 may be positioned inside the first and second serve chambers SC1 and SC2, respectively, and may control temperature inside chambers via radiation heat.

The first and second serve chambers SC1 and SC2 may respectively include a first residual gas analyzer RGA1 and a second residual gas analyzer RGA2 for identifying whether either the first reactant 41 or the second reactant 42 is detected.

Each of the first and second serve chambers SC1 and SC2 may include at least one exhaust unit. Each of the exhaust units may be configured to exhaust gas from the first or second serve chambers SC1 and SC2.

A sealing member may be disposed between a side wall of each of the first and second serve chambers SC1 and SC2 and the polymer substrate 101. The sealing members may seal the first and second serve chambers SC1 and SC2, respectively.

A process of forming a flexible substrate will be described in more detail below with reference to FIG. 5 and FIG. 6. The manufacturing apparatus described with reference to FIG. 6 is an exemplary apparatus; however exemplary embodiments of the present invention are not limited thereto.

The polymer substrate 101 may be positioned between the first and second serve chambers SC1 and SC2, and the pressure inside the first and second serve chambers SC1 and SC2 may be maintained at equal to or less than about $10^{-2}$ Torr. Viewed from above, since an area of the polymer substrate 101 is larger than areas of the first and second serve chambers SC1 and SC2, a closed space may be formed by the first and second serve chambers SC1 and SC2, and the polymer substrate 101. The polymer substrate 101 may be provided in a roll-to-roll shape. However, exemplary embodiments of the present invention are not limited thereto.

The first reactant 41 may infiltrate into the polymer substrate 101 from above the polymer substrate 101. The first reactant 41 may be injected into the first serve chamber SC1 through the first gas supplier G1. Thus, the pressure in the first serve chamber SC1 may become higher than that in the second serve chamber SC2. As an example, the pressure above the polymer substrate 101 may become higher than that below the polymer substrate 101. The first reactant 41 may diffuse into the polymer substrate 101 due to a pressure difference between above and below the polymer substrate 101. As an example, the first reactant 41 may infiltrate into the inside of the polymer substrate 101 through the top surface of the polymer substrate 101 and at least up to the neutral plane NP of the polymer substrate 101. According to an exemplary embodiment of the present invention, when the first reactant 41 is injected into the first serve chamber SC1, an inside pressure of the first serve chamber SC1 may be from about $10^{-2}$ Torr to about 1 Torr, and an inside pressure of the second serve chamber SC2 may be from about $10^{-6}$ Torr to about $10^{-2}$ Torr.

The second reactant 42 may infiltrate into the polymer substrate 101 from below the polymer substrate 101. The second reactant 42 may be injected into the second serve chamber SC2 through the second gas supplier G2. The second reactant 42 may diffuse into the polymer substrate 101 by controlling the pressure in the second serve chamber SC2 to be higher than that in the first serve chamber SC1. As an example, the pressure above the polymer substrate 101 may be controlled to be lower than that below the polymer substrate 101. According to an exemplary embodiment of the present invention, when the second reactant 42 is injected into the second serve chamber SC2, the inside pressure of the first serve chamber SC1 may be from about $10^{-6}$ Torr to about $10^{-2}$ Torr, and that of the second serve chamber SC2 may be from about $10^{-2}$ Torr to about 1 Torr. The pressure in the first serve chamber SC1 may be controlled such that the first reactant 41 is positioned near the neutral plane NP of the polymer substrate 101. The second reactant 42 may infiltrate into the inside of the polymer substrate 101 through the bottom surface of the polymer substrate 101 and at least up to the neutral plane NP of the polymer substrate 101.

The first reactant 41 may include a gas forming the inorganic material via a reaction with the second reactant 42 and need not be limited to a particular material. For example, the first reactant 41 may use water ($H_2O$), ozone ($O_3$), ammonia ($NH_3$), oxygen ($O_2$), hydrogen ($H_2$), or air. According to an exemplary embodiment of the present invention, the first reactant 41 may be $H_2O$. In the case of $H_2O$, since absorption of $H_2O$ into the polymer substrate 101 may occur, a removal of $H_2O$ from the polymer substrate 101 may be performed. According to an exemplary embodiment of the present invention, $H_2O$ may be used as the first reactant 41 to react with the second reactant 42 and the removal of $H_2O$ from the polymer substrate 101 may be substantially simultaneously performed with formation of the first barrier region 103.

The second reactant 42 may be a gas forming the inorganic material via a reaction with the first reactant 41 and need not be limited to a particular material. For example, second reactant 42 may include tetrakis(dimethylamino)

silane (TDMAS), tetrakis(ethylmethylamino)silane (TEMASi), tris(ethlymethylamino)silane (Tris-EMAS), tris(dimethylamino)silane (Tris-DMAS), tetraethyl orthosilicate (TEOS), bis(ethylmethylamino)silane (BEMAS), bis(diethylamino)silane (BDEAS), trimethylaluminum (TMA), tris (tertiary-butyl) aluminum (TTBA), tetrakis(ethylmethylamino)zirconium (TEMAZ), titanium tetrachloride ($TiCl_4$), tetrakis(dimethylamino)titanium (TDMAT), tetrakis(ethylmethylamino)titanium (TEMAT), tetrakis(diethylamino)titanium (TDEAT), titanium tetraisopropoxide (TTIP), tertiary-butyl-imido tri(diethylamino)tantalum (TBTDET), tetrakis(ethylmethylamino)hafnium (TEMAH), tertiary-butyl-imido tris(ethylmethylamino) tantalum (TBITEMATa), polyethylene terephthalate (PET), strontium (2,2,6,6-tetramethyl-3,5-heptanedionate)$_2$ (Sr(thd)$_2$), or tetrakis(ethylmethylamino) antimony (TEMASb).

The injecting of the first reactant 41 and the injecting of the second reactant and 42 may be sequentially performed. However, exemplary embodiments of the present invention are not limited thereto. The injections of the first and second reactants 41 and 42 may be substantially simultaneously performed.

The first and second reactants 41 and 42 may infiltrate into the inside of the polymer substrate 101, react with each other near the neutral plane NP of the polymer substrate 101, and form the first inorganic material 51. The first inorganic material 51 may fill the free volume 50 of the polymer substrate 101 and form the first barrier region 103. A desired temperature for the reaction of the first and second reactants 41 and 42 may be respectively provided via the first and second temperature controllers TC1 and TC2 inside the corresponding chambers.

The first inorganic material 51 may include at least one of silicon nitride, aluminum nitride, zirconium nitride, titanium nitride, hafnium nitride, tantalum nitride, silicon oxide, aluminum oxide, titanium oxide, tin oxide, serium oxide, or SiON.

Since the first and second reactants 41 and 42 may react with each other near the neutral plane NP of the polymer substrate 101, at least a portion of the first barrier region 103 may be on the neutral plane NP of the polymer substrate 101.

The density of the first inorganic material 51 may decrease from a center thickness of the first barrier region 103 toward upper and lower surfaces of the polymer substrate 101.

When the first barrier region 103 is formed, the second barrier region 105 separated from the first barrier region 103 may also be formed, but a volume of the second barrier region 105 may be less than that of the first barrier region 103.

While the first reactant 41 is injected into the first serve chamber SC1, whether the first reactant 41 has been detected in the second serve chamber SC2 may be identified. This operation may be performed by the second residual gas analyzer RGA2. As an example, formation of barrier regions inside the polymer substrate 101 may be identified by detecting none of the first reactant 41 in the second serve chamber SC2. As an example, formation of barrier regions may be identified by detecting none of the second reactant 42 in the first serve chamber SC1 while the second reactant 42 is injected into the second serve chamber SC2.

Since the first and second serve chambers SC1 and SC2 may be separated from each other via the polymer substrate 101, only one reactant may be supplied to respective serve chambers SC1 and SC2. Thus, contamination inside the first and second serve chambers SC1 and SC2 may be reduced or eliminated and formation of the first barrier region 103 may be identified substantially immediately by the residual gas analyzers RGA1 and RGA2.

Figure 7:
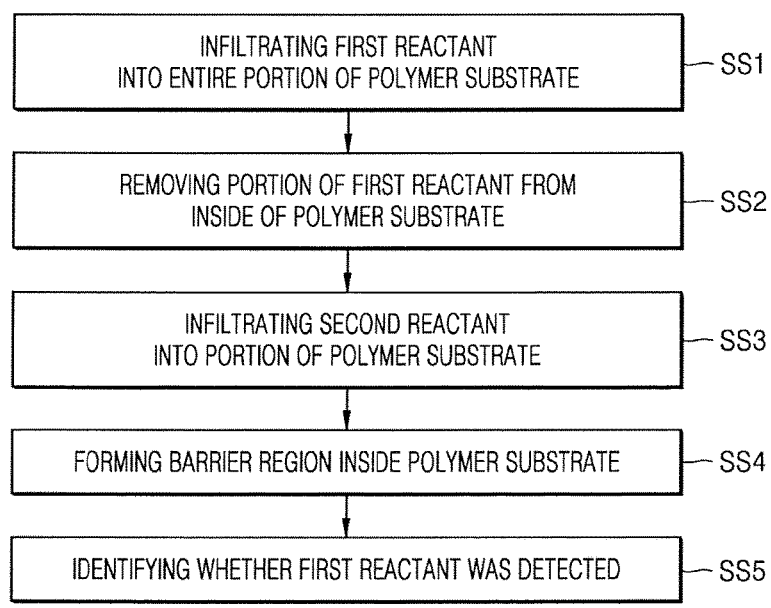
FIG. 7 is a flowchart of a method of manufacturing a flexible substrate according to an exemplary embodiment of the present invention.

FIG. 7 is a flowchart of a method of manufacturing a flexible substrate according to an exemplary embodiment of the present invention. FIGS. 8A to 8E are diagrams illustrating a method of manufacturing a flexible substrate according to an exemplary embodiment of the present invention.

Referring to FIG. 7, a method of manufacturing the flexible substrate may include infiltrating the first reactant 41 into an entire portion of the polymer substrate 101 (SS1). The method of manufacturing the flexible substrate may include removing a portion of the first reactant 41 from inside the polymer substrate 101 (SS2). The method of manufacturing the flexible substrate may include infiltrating the second reactant 42 into a portion of the polymer substrate 101 (SS3). The method of manufacturing the flexible substrate may include forming the first barrier region 103 inside the polymer substrate 101 (SS4). The method of manufacturing the flexible substrate may include identifying whether the first reactant 41 was detected (SS5).

Figure 8A:
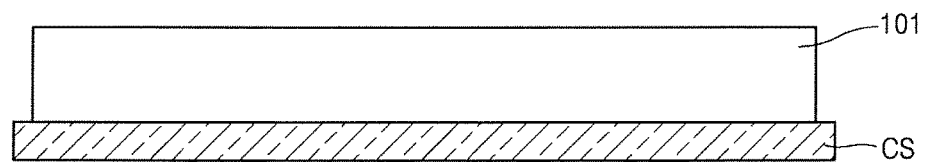
FIG. 8A is a diagram illustrating a method of manufacturing a flexible substrate according to an exemplary embodiment of the present invention.

Referring to FIG. 8A, the polymer substrate 101 may be on a carrier substrate CS. The carrier substrate CS may be, for example, a glass substrate. The carrier substrate CS may have sufficient hardness to prevent the flexible polymer substrate 101 from being bent or deformed during a manufacturing process.

Figure 8B:
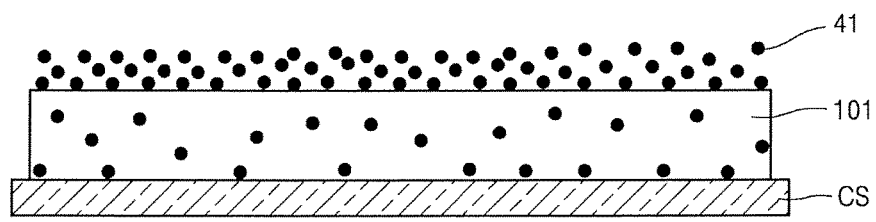
FIG. 8B is a diagram illustrating a method of manufacturing a flexible substrate according to an exemplary embodiment of the present invention.

Referring to FIG. 8B, the polymer substrate 101 may be exposed to an environment having the first reactant 41 in a relatively high concentration and the first reactant 41 may infiltrate into substantially the entire polymer substrate 101. The first reactant 41 may include a material forming an inorganic material via a reaction with the second reactant 42 and the first reactant 41 need not be limited to a particular material. For example, the first reactant 41 may include $H_2O$, $O_3$, or $NH_3$.

According to an exemplary embodiment of the present invention, the first reactant 41 may include a liquid such as the water ($H_2O$). In this case, for infiltrating the first reactant 41 into substantially the entire polymer substrate 101, a method of immersion of the polymer substrate 101 in a liquid such as the water may allow the first reactant 41 to diffuse into substantially the entire polymer substrate 101.

According to an exemplary embodiment of the present invention, the first reactant 41 may be a gas. In this case, for infiltrating the first reactant 41 into substantially the entire portion of the polymer substrate 101, the polymer substrate 101 may be placed in a vessel such as an oven having the first reactant 41 in a relatively high concentration.

The first reactant 41 may be injected from above the polymer substrate 101 and allowed to diffuse after the polymer substrate 101. The polymer substrate 101 may be positioned in a vacuum chamber maintaining a certain pressure for infiltrating the first reactant 41 into the polymer substrate 101. Thus, it may take a relatively long amount of time for the first reactant 41 to diffuse into substantially the entire polymer substrate 101. Thus, when a traditional atomic layer deposition (ALD) equipment or chemical vapor deposition (CVD) equipment is used for infiltrating the first reactant 41 into the polymer substrate 101, a cost and an amount of time for diffusing the first reactant 41 into the polymer substrate may be relatively high.

However, an exemplary embodiment of the present invention, since the polymer substrate 101 is positioned in a vessel with the first reactant 41 in a relatively high concentration, separate vacuum equipment might not be used and thus, manufacturing time and cost may be reduced. A plurality of polymer substrates 101 can be simultaneously placed in a vessel having the first reactant 41 in a relatively high concentration, thus increasing efficiency in terms of cost and time for diffusing the first reactant 41 into the polymer substrate.

Figure 8C:
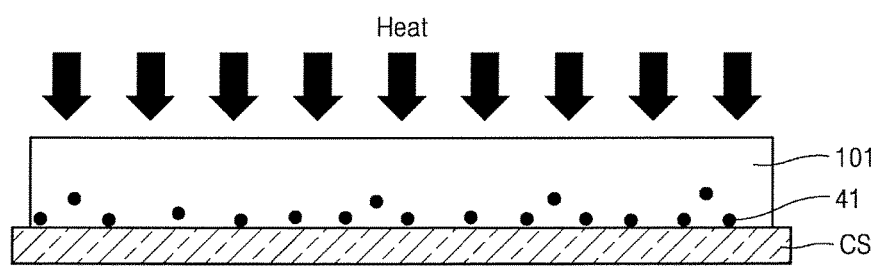
FIG. 8C is a diagram illustrating a method of manufacturing a flexible substrate according to an exemplary embodiment of the present invention.

Referring to FIG. 8C, a portion of the first reactant 41 may be removed by applying heat. For example, heat may be applied from above the polymer substrate 101. When heat is applied from above the polymer substrate 101, the first reactant 41 which was diffused near the top surface of the polymer substrate 101 may escape from the polymer substrate 101, while the first reactant 41 which was diffused near the bottom surface (e.g., near the carrier substrate CS) may remain.

Figure 8D:
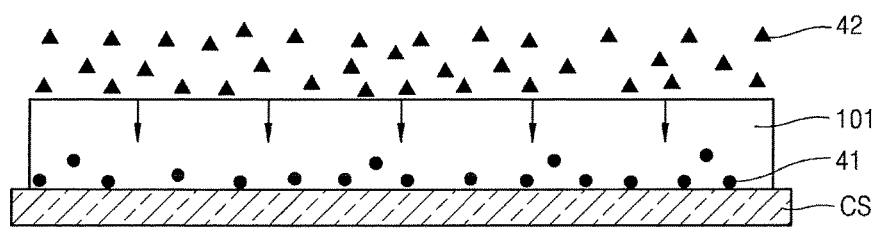
FIG. 8D is a diagram illustrating a method of manufacturing a flexible substrate according to an exemplary embodiment of the present invention.
Figure 8E:
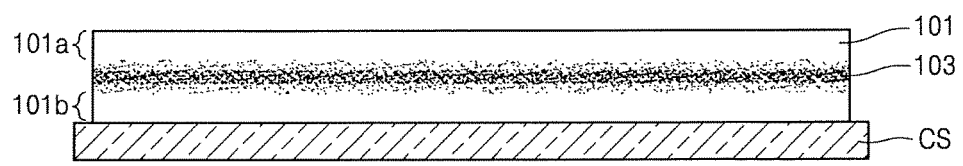
FIG. 8E is a diagram illustrating a method of manufacturing a flexible substrate according to an exemplary embodiment of the present invention.

Referring to FIG. 8D, the polymer substrate 101 may then be exposed to the second reactant 42. The second reactant 42 may be a material forming the inorganic material via a reaction with the first reactant 41 and need not be limited to a particular material. For example, second reactant 42 may include tetrakis(dimethylamino)silane (TDMAS), tetrakis(ethylmethylamino)silane (TEMASi), tris(ethlymethylamino)silane (Tris-EMAS), tris(dimethylamino)silane (Tris-DMAS), tetraethyl orthosilicate (TEOS), bis(ethylmethylamino)silane (BEMAS), bis(diethylamino)silane (BDEAS), trimethylaluminum (TMA), tris(tertiary-butyl) aluminum (TTBA), tetrakis(ethylmethylamino) zirconium (TEMAZ), titanium tetrachloride (TiCl$_4$), tetrakis(dimethylamino)titanium (TDMAT), tetrakis(ethylmethylamino)titanium (TEMAT), tetrakis(diethylamino)titanium (TDEAT), titanium tetraisopropoxide (TTIP), tertiary-butyl-imido tri(diethylamino)tantalum (TBTDET), tetrakis(ethylmethylamino)hafnium (TEMAH), tertiary-butyl-imido tris(ethylmethylamino) tantalum (TBITEMATa), polyethylene terephthalate (PET), strontium (2,2,6,6-tetramethyl-3,5-heptanedionate)$_2$ (Sr(thd)$_2$), or tetrakis(ethylmethylamino) antimony (TEMASb).

The polymer substrate 101 may be positioned in a vessel having the second reactant 42 in a relatively high concentration for infiltrating the second reactant 42 into substantially the entire polymer substrate 101. Since the bottom surface of the polymer substrate 101 may be covered by the carrier substrate CS, the second reactant 42 may diffuse into the inside of the polymer substrate 101 mainly through the top surface of the polymer substrate 101. According to an exemplary embodiment of the present invention, vacuum chamber equipment may be used to infiltrate the second reactant 42 into the polymer substrate 101. Diffusion of the second reactant 42 in substantially the entire polymer substrate 101 may be omitted. As an example, the second reactant 42 may be diffused only to near the neutral plane NP of the polymer substrate 101 to react with the first reactant 41 using vacuum chamber equipment. Thus, use of vacuum chamber equipment for diffusion of the second reactant 42 need not be disadvantageous with respect to processing time. A fact that the vacuum chamber equipment is used may illustrate that only the second reactant 42 is injected to react with the first reactant 41 after the polymer substrate 101 was maintained in a vacuum state before injecting the second reactant 42. Thus, since the first reactant 41 becomes subject to a relatively low pressure in the vacuum chamber after having infiltrated down to the bottom surface of the polymer substrate 101, the first reactant 41 may easily diffuse near the neutral plane NP of the polymer substrate 101. Thus, an infiltration of other materials than the second reactant 42 may be reduced or prevented.

The pressure inside the vacuum chamber may increase while the second reactant 42 is injected. When the second reactant 42 is exposed to the polymer substrate 101 the second reactant 42 may diffuse toward the neutral plane NP from above the polymer substrate 101, and the first reactant 41 near the bottom surface of the polymer substrate 101 may diffuse toward the top surface of the polymer substrate 101. Thus, the first and second reactants 41 and 42 may react with each other near the neutral plane NP of the polymer substrate 101 to form the first inorganic material 51. The first inorganic material 51 may fill the free volume 50 of the polymer substrate 101 and may form the first barrier region 103, and thus, the flexible substrate 100 may be formed.

The first inorganic material 51 may include at least one of silicon nitride, aluminum nitride, zirconium nitride, titanium nitride, hafnium nitride, tantalum nitride, silicon oxide, aluminum oxide, titanium oxide, tin oxide, serium oxide, or SiON.

Since the first and second reactants 41 and 42 react with each other near the neutral plane NP of the polymer substrate 101, at least a portion of the first barrier region 103 may be near the neutral plane NP of the polymer substrate 101.

The density of the first inorganic material 51 may decrease from the center thickness of the first barrier region 103 toward upper and lower surfaces of the polymer substrate 101.

When the first barrier region 103 is formed, the second barrier region 105 separated from the first barrier region 103 may also be formed, but a volume of the second barrier region 105 may be less than that of the first barrier region 103.

The formed flexible substrate 100 may be positioned in the first and second serve chambers SC1 and SC2 respectively having the first and second residual gas analyzers RGA1 and RGA2, and whether the first reactant 41 has infiltrated into the inside of chambers may be identified, and then, formation of the first barrier region 103 may be identified.

The flexible substrates 100 and 100' according to an exemplary embodiment of the present invention may be applicable in various areas. Below, a case in which the flexible substrates 100 and 100' are employed in a display apparatus having the bending area will be described in more detail as an example. However, the flexible substrates 100 and 100' may be employed in a foldable or rollable display apparatus or a display apparatus without a bending area.

A display apparatus may be an apparatus displaying an image, and may include a liquid crystal display, an electrophoretic display, an organic light-emitting display, an inorganic light-emitting display, a field emission display, a surface-conduction electron-emitter display, a plasma display, or a cathode ray display.

Below, a display apparatus according to an exemplary embodiment of the present invention will be described in more detail with the organic light-emitting display as an example. However, a display apparatus according to exemplary embodiments of the present invention is not limited thereto and various display apparatuses may include the flexible substrates according exemplary embodiments of the present invention.

Figure 9:
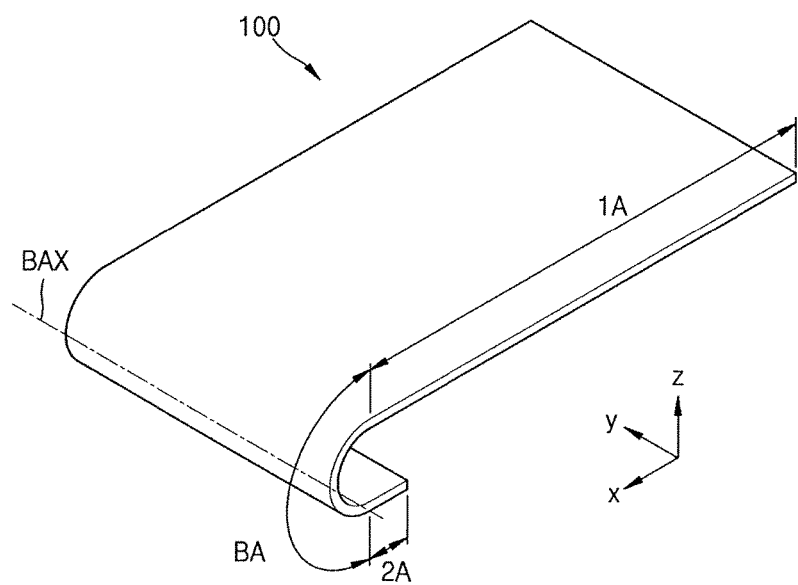
FIG. 9 is a perspective view of a portion of a display apparatus according to an exemplary embodiment of the present invention.
Figure 10:
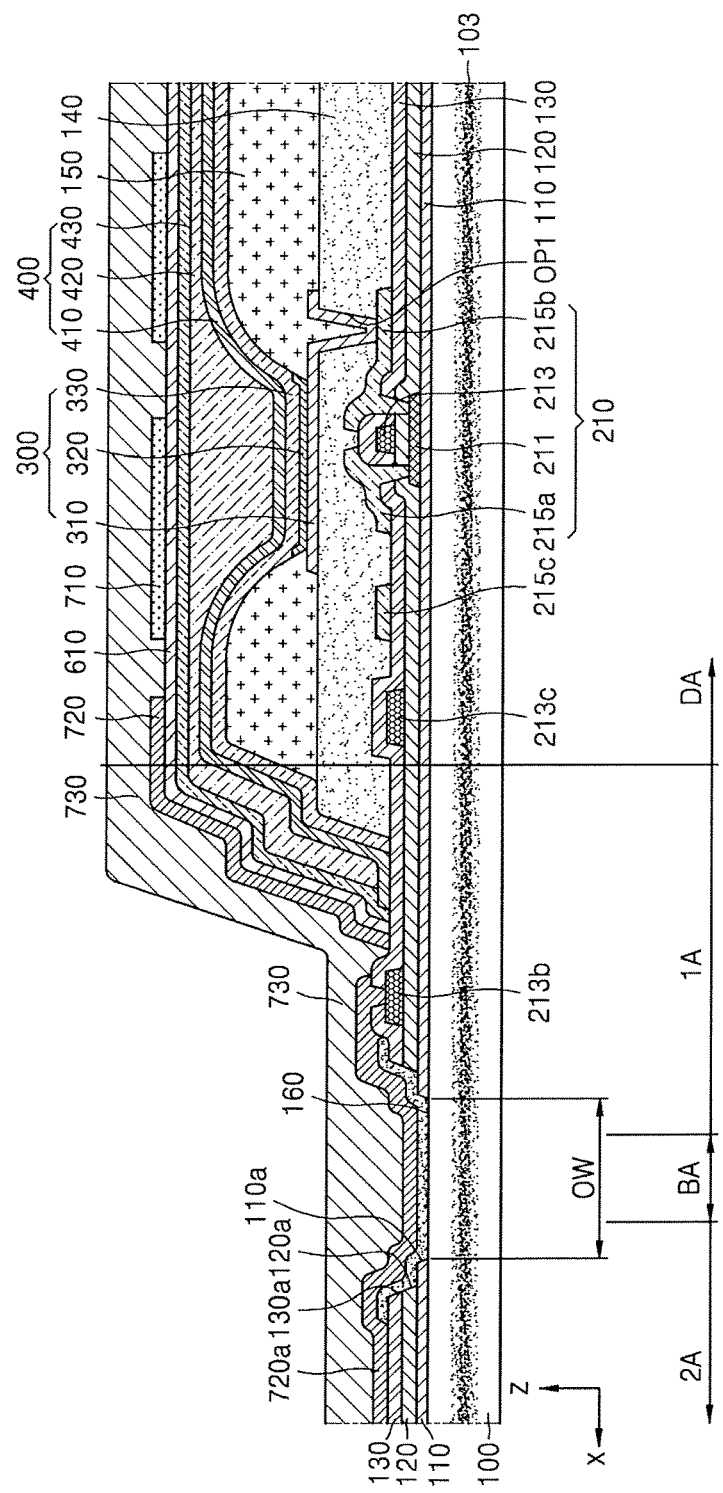
FIG. 10 is a cross-sectional view of a portion of the display apparatus of FIG. 9.

FIG. 9 is a perspective view of a portion of a display apparatus according to an exemplary embodiment of the present invention. FIG. 10 is a cross-sectional view of a portion of the display apparatus of FIG. 9. According to an exemplary embodiment of the present invention, a portion of a flexible substrate 100 included in the display apparatus may have a bent shape and thus, a portion of the display apparatus may have substantially a same bent shape as the flexible substrate 100. However, the display apparatus described with reference to FIGS. 9 and 10 is illustrated in an un-bent state in FIG. 10.

Referring to FIGS. 9 and 10, the flexible substrate 100 included in the display apparatus according to an exemplary embodiment of the present invention may be divided into a display area DA in which a display device is positioned for displaying an image and a non-display area around the display area DA. The non-display area may include a bending area BA which is bent around a bending axis BAX as a center bending axis. The bending area BA may refer to an area having a radius of curvature after bending.

The bending area BA may extend in a first direction (+y direction) and be between a first area 1A and a second area 2A in a second direction (+x direction) crossing the first direction. The flexible substrate 100 may be bent along a bending axis BAX, which extends in the first direction (+y direction), as a center.

The flexible substrate 100 may include the first barrier region 103, and thus moisture and oxygen, which may enter from the outside, may be reduced or prevented from infiltrating into a display device 300. The first barrier region 103 may be positioned, at least in part, in the neutral plane NP of the flexible substrate 100. Thus, even when the flexible substrate 100 is bent in the bending area BA, the crack occurrence in the first barrier region 103 may be reduced or prevented.

The first area 1A may include the display area DA. The first area 1A may include a portion of the non-display area in addition to the display area DA. The second area 2A may also include the non-display area. The bending area BA and/or the second area 2A may also include the display area DA.

A plurality of pixels may display an image in the display area DA of the flexible substrate 100. Elements such as a thin film transistor (TFT) 210, an organic light-emitting diode (OLED), and a capacitor (Cst) may be in the display area DA.

The display area DA may include a gate line transmitting a gate signal, a data line transmitting a data signal, a driving power line transmitting power, and a common power line. The display area may include a first signal wire 213b. The pixel may be configured to display the image via electrical signals provided from the TFT, the Cst, and the OLED, which are connected to the gate line, the data line, and the driving power line. The pixel P may emit light at a brightness corresponding to a driving current passing through the OLED in response to the data signal according to a driving power supplied to the pixel and the common power. The first signal wire 213b may be connected to a driving circuit unit via a fan-out wire 720a. The pixel may include a plurality of pixels P, which may be arranged in various shapes such as a stripe array and a PenTile array.

The fan-out wire 720a may be in the non-display area and may be connected to the first signal wire 213b applying an electrical signal to the TFT 210 or the display device 300 in the display area DA. The first signal wire 213b may correspond to various wires in the display area DA, such as the gate line GL, the data line DL, the driving power line, and the common power line. The fan-out wire 720a may be connected to the first signal wire 213b and a portion thereof may be in the bending area BA. In an exemplary embodiment of the present invention, the fan-out wire 720a may extend from the first area 1A to a portion of the bending area BA or to the second area 2A through the bending area BA.

The display device 300 may include the OLED in the display area DA. The OLED may be electrically connected to the TFT 210 and thus a pixel electrode 310 may be electrically connected to the TFT 210. A thin film transistor (TFT) may be in a peripheral area outside the display area DA of the flexible substrate 100. The TFT in the peripheral area may be, for example, a portion of a circuit unit for controlling an electrical signal applied to the display area DA.

The TFT 210 may include a semiconductor layer 211, a gate electrode 213, a source electrode 215a, and a drain electrode 215b, which may each include amorphous silicon, polycrystalline silicon, oxide semiconductor or organic semiconductor materials.

The gate electrode 213 may be connected to a gate wire which provides an on/off signal to the TFT 210 and may include a relatively low-resistance metal material. For example, the gate electrode 213 may have a single-layer or a multi-layer structure. Each layer may include at least one conductive material, such as, molybdenum (Mo), aluminum (Al), copper (Cu) and/or titanium (Ti).

The source electrode 215a and the drain electrode 215b may have a single-layer or a multi-layer structure having relatively high conductivity. The source electrode 215a and the drain electrode 215b may be respectively connected to a source area and a drain area of the semiconductor layer 211. For example, the source electrode 215a and the drain electrode 215b may have a single-layer or a multi-layer structure. Each layer may include at least one conductive material, such as, Al, Cu and/or Ti.

The TFT 210 according to an exemplary embodiment of the present invention may be a top gate type TFT in which the gate electrode 213 is above the semiconductor layer 211, but exemplary embodiments of the present invention are not limited thereto. The TFT 210 according to an exemplary embodiment of the present invention may be a bottom gate type TFT in which the gate electrode 213 is under the semiconductor layer 211.

A gate insulating layer 120 including inorganic materials such as silicon oxide, silicon nitride, and/or silicon oxynitride for securing insulation between the semiconductor layer 211 and the gate electrode 213 may be between the semiconductor layer 211 and the gate electrode 213. An interlayer insulating layer 130 including inorganic materials such as silicon oxide, silicon nitride, and/or silicon oxynitride may be on the gate electrode 213, and the source electrode 215a and the drain electrode 215b may be on the interlayer insulating layer 130. Insulating layers including inorganic materials may be formed via the CVD or ALD.

A buffer layer 110 including inorganic materials such as silicon oxide, silicon nitride, and/or silicon oxynitride may be between the TFT 210 and the flexible substrate 100. The buffer layer 110 may increase flatness of a top surface of the flexible substrate 100, and may prevent or reduce infiltration of impurities from the flexible substrate 100 to the semiconductor layer 211 of the TFT 210. The buffer layer 110 may have a single-layer or multi-layer structure.

A planarization layer 140 may be on the TFT 210. For example, when the OLED is above the TFT 210, the planarization layer 140 may planarize a top surface of a protection layer covering the TFT 210. The planarization layer 140 may include, for example, organic materials such as PI, acryl, benzocyclobutene (BCB), or hexamethyldisiloxane (HMDSO). The planarization layer 140 may have a single-layer structure; however, the planarization layer 140 may be variously modified. For example, the planarization layer 140 may have a multi-layer structure.

The OLED may include the pixel electrode 310, a counter electrode 330, and an intermediate layer 320. The intermediate layer may be between the pixel electrode 310 and the counter electrode 330. The OLED my include an organic light-emitting layer, and may be on the planarization layer 140, in the display area DA of the flexible substrate 100. The pixel electrode 310 may contact any one of the source electrode 215a and the drain electrode 215b via an opening OP1 formed in the planarization layer 140. The pixel electrode 310 may be electrically connected to the TFT 210.

A pixel definition layer 150 may be on the planarization layer 140. The pixel definition layer 150 may define a pixel by having an opening corresponding to respective sub-pixels. The opening may expose at least a central portion of the pixel electrode 310. The pixel definition layer 150 may reduce or prevent an occurrence of an arc on edges of the pixel electrode 310 by increasing a distance between edges of the pixel electrode 310 and the counter electrode 330 above the pixel electrode 310. The pixel definition layer 150 may include, for example, organic materials such as PI, acryl, BCB or HMDSO.

The intermediate layer 320 of the OLED may include one or more relatively low molecular weight materials or polymer materials. When the intermediate layer 320 includes low molecular weight materials, a hole injection layer (HIL), a hole transport layer (HTL), an emission layer (EML), an electron transport layer (ETL), and/or an electron injection layer (EIL) may have laminated structures with a single-layer or multiple layers, and may include various organic materials such as copper phthalocyanine (CuPc), N,N'-Di (naphthalene-1-yl)-N,N'-diphenyl-benzidine (NPB), or tris (8-hydroxyquinoline) aluminum (Alq3). The above-described layers may be formed via a vacuum deposition method.

When the intermediate layer 320 includes polymer materials, the intermediate layer 320 may have a structure which includes an HTL and an EML. As an example, the HTL may include poly 3,4-ethylenedioxythiophene (PEDOT) and the light-emitting layer may include relatively high molecular weight (e.g., polymer) materials such as poly-phenylenevinylene (PPV) and polyfluorene. The intermediate layer 320 may be formed via screen printing, inkjet printing, or laser induced thermal imaging (LITI). However, exemplary embodiments of the present invention are not limited thereto, and the intermediate layer 320 may have various other structures. As an example, the intermediate layer 320 may include an integrated layer disposed on a plurality of pixel electrodes 310 and may include a patterned layer corresponding to each of the plurality of pixel electrodes 310.

The counter electrode 330 may be on a top portion of the display area DA and may cover the display area DA. As an example, the counter electrode 330 may have an integrated structure including a plurality of OLEDs and thus, may correspond to the plurality of pixel electrodes 310.

The OLED may be damaged by humidity, or oxygen from outside the OLED. An encapsulation layer 400 may protect the OLEDs by encapsulating the OLEDs. The encapsulation layer 400 may cover the display area DA and extend to the outside of the display area DA. The encapsulation layer 400 may include a first inorganic encapsulation layer 410, an organic encapsulation layer 420, and a second inorganic encapsulation layer 430.

The first inorganic encapsulation layer 410 may cover the counter electrode 330, and may include silicon oxide, silicon nitride, and/or silicon oxynitride. Other layers such as a capping layer may be between the first inorganic encapsulation layer 410 and the counter electrode 330. The first inorganic encapsulation layer 410 may take on a shape of an underlying structure, and thus a top surface of the first inorganic encapsulation layer 410 need not be flat. The organic encapsulation layer 420 may cover the first inorganic encapsulation layer 410, and a top surface thereof may be generally smooth. As an example, the top surface of the organic encapsulation layer 420 may be substantially flat in an area corresponding to the display area DA. The organic encapsulation layer 420 may include at least one material, such as, PET, PEN, PC, PI, PES, polyoxymethylene (POM), polyallylate, or HMDSO. The second inorganic encapsulation layer 430 may cover the organic encapsulation layer 420, and may include silicon oxide, silicon nitride, and/or silicon oxynitride. The second inorganic encapsulation layer 430 may prevent the organic encapsulation layer 420 from being exposed to the outside by contacting the first inorganic encapsulation layer 410 at an edge outside the display area DA.

Since the encapsulation layer 400 includes the first inorganic encapsulation layer 410, the organic encapsulation layer 420, and the second encapsulation layer 430, even when a crack occurs in the encapsulation layer 400, the crack need not be connected between the first inorganic encapsulation layer 410 and the organic encapsulation layer 420 or between the organic encapsulation layer 420 and the second encapsulation layer 430. Thus, the formation of an infiltration route of humidity or oxygen from the outside to the display area DA may be prevented or reduced.

A touch electrode 710 may be above the encapsulation layer 400, and a cover layer 730 protecting the touch electrode 710 may be on the touch electrode 710.

The touch electrode 710 may be connected to a touch wire 720 for transmitting a signal therefrom, and the touch wire 720 may extend to the non-display area from above the encapsulation layer 400 along an end surface of the encapsulation layer 400. The touch wire 720 may be connected to the touch electrode 710 and at least a portion thereof may extend from above the encapsulation layer 400 to be in the bending area BA. According to an exemplary embodiment of the present invention, the touch wire 720 may extend through the bending area BA. The touch wire 720 may extend from above the encapsulation layer 400 along an end surface of the encapsulation layer 400, and in this case, the end surface of the encapsulation layer 400 may include curves. The curves may be formed by forming steps between the planarization layer 140 and the pixel definition layer 150. The touch wire 720 may extend to the non-display area with gradual slopes from above the encapsulation layer 400 via the curves.

The touch electrode 710 and the touch wire 720 may have a single-layer or a multi-layer structure. Each layer may include at least one material that is relatively highly conductive. For example, the touch electrode 710 and the touch wire 720 may include a single-layer or multiple layers including conductive materials, such as Al, Cu and/or Ti. The touch electrode 710 may include the same material as the touch wire 720.

The cover layer 730 may be flexible, and may include polymethyl methacrylate (PMMA), polydimethylsiloxane (PDMS), PI, acrylate, PET, or PEN. The cover layer 730 may extend to the non-display area and cover the fan-out wire 720a. Thus, the cover layer 730 may protect both a touch electrode 710 and the fan-out wire 720a. The cover layer 730 may extend from the display area DA to at least the bending area BA.

A touch buffer layer 610 may be between the encapsulation layer 400 and the touch screen layer 700. The touch buffer layer 610 may protect the encapsulation layer 400 and may block an interference signal which can occur during an operation of the touch screen layer 700. The touch buffer layer 610 may include inorganic materials such as silicon oxide, silicon nitride, silicon oxynitride, aluminum oxide, aluminum nitride, titanium oxide, or titanium nitride, or organic materials such as PI, polyester or acryl, and may include a laminated layer including one or more of the materials described above.

The touch buffer layer 610 may be directly formed on the encapsulation layer 400 via a deposition process. Since the touch screen layer 700 may also be directly formed on the touch buffer layer 610, a separate adhesive layer may be omitted on the encapsulation layer 400. Thus, a thickness of the display apparatus may be reduced.

The non-display area may include the bending area BA. The fan-out wire 720a crossing the bending area BA may be included in the non-display area. The fan-out wire 720a may be electrically connected to first, second, and third signal wires 213b, 213c, and 215c which may apply electrical signals to the TFT 210 or the display device 300 in the display area DA. The fan-out wire 720a and the first, second, and third signal wires 213b, 213c, and 215c may be electrically connected to each other may and may the fan-out wire 720a directly connected to the first signal wire 213b via a contact hole as well as the fan-out wire 720a indirectly connected to the second or third signal wire 213c or 215c.

The first signal wire 213b may be electrically connected to the second or third signal wire 213c or 215c in the display area DA. According to an exemplary embodiment of the present invention, the second or third signal wire 213c or 215c may be the gate line applying a signal to the gate electrode 213. According to an exemplary embodiment of the present invention, the second or third signal wire 213c or 215c may be the data line applying a signal to the source electrode 215a or the drain electrode 215b. According to an exemplary embodiment of the present invention, the first signal wire 213b may be connected to the second signal wire 213c via a via hole.

According to an exemplary embodiment of the present invention, the first and second signal wires 213b and 213c may include a same material as the gate electrode 213. The third signal wire 215c may include a same material as the source electrode 215a and the drain electrode 215b. According to an exemplary embodiment of the present invention, the fan-out wire 720a may include a same material as the third signal wire 215c. Alternatively, the fan-out wire 720a may include a same material as the touch wire 720.

An organic material layer 160 may be in at least a portion of a space between the fan-out wire 720a and the flexible substrate 100 in the bending area BA. When the display apparatus is subject to bending, the organic material layer 160 may reduce or prevent an occurrence of cracks in the fan-out wire 720a in the bending area BA. The organic material layer 160 may absorb tensile stress caused by bending in the flexible substrate 100 and may reduce a concentration of tensile stress in the fan-out wire 720a.

The organic material layer 160 may be substantially simultaneously formed with the planarization layer 140 or the pixel definition layer 150, and may include a same material as the planarization layer 140 and/or the pixel definition layer 150. As an example, the organic material layer 160 may be substantially simultaneously formed in a mask process for forming the planarization layer 140 or the pixel definition layer 150 and thus, a separate mask process for forming the organic material layer 160 may be omitted.

The buffer layer 110, the gate insulating layer 120 and the interlayer insulating layer 130 may be collectively referred to as an inorganic insulating layer. The inorganic insulating layer may include an opening in a position corresponding to the bending area BA. As an example, the buffer layer 110, the gate insulating layer 120 and the interlayer insulating layer 130 may respectively include openings 110a, 120a, and 130a corresponding to the bending area BA. The openings corresponding to the bending area BA may be referred to as the openings overlapping the bending area BA. An area of each of the openings may be larger than that of the bending area BA. As an example, a width of an opening OW may be greater than a width of the bending area BA. The area of the openings may be defined as the area of the opening with the smallest area among the openings 110a, 120a, and 130a of the buffer layer 110, the gate insulating layer 120, and the interlayer insulating layer 130. As an example, the area of the opening may be defined as the area of the opening 110a of the buffer layer 110.

The display apparatus according to an exemplary embodiment of the present invention may include the organic material layer 160 filling at least a portion of openings of the inorganic material layer. As an example, the organic material layer 160 may fill all of the openings. The fan-out wire 720a may extend from the first area 1A to the second area 2A through the bending area BA. The fan-out wire may be on the organic material layer 160. The fan-out wire 720a may be on the inorganic material layer, including the interlayer insulating layer 130, when the organic material layer 160 is omitted.

Since a hardness of the inorganic insulating layer may be higher than that of the organic material layer 160, a probability of the crack occurrence in the inorganic insulating layer in the bending area BA may be relatively high. When a crack occurs in the inorganic insulating layer, a probability that the crack propagates up to the fan-out wire 720a may be relatively high. Thus, the propagation of the crack may be blocked by the organic material 160. However, the probability of the crack occurrence in the inorganic material layer may be further reduced by forming the openings in the inorganic insulating layer. Thus, the concentration of tensile stress in the fan-out wire 720a may be reduced.

Referring to FIG. 10, the organic material layer 160 may cover an inside surface of the openings of the inorganic material layer. A conductive material layer may be formed on substantially the entire surface of the flexible substrate 100. The conductive material layer may be patterned to form various wires. When the organic material layer 160 does not cover the inside surface of the opening 110a of the buffer layer 110, the inside surface of the opening 120a of the gate insulating layer 120, or the inside surface of the opening 130a of the interlayer insulating layer 130, during a process of patterning the conductive material layer, the conductive material need not be removed from the inside surface of the opening 110a of the buffer layer 110, the inside surface of the opening 120a of the gate insulating layer 120, or the inside surface of the opening 130a of the interlayer insulating layer 130. In this case, the remaining conductive material may cause a short between other conductive layers. Thus, when the organic material layer 160 is formed, the organic material layer 160 may cover the inside surfaces of openings of the inorganic material layer. The organic material layer 160 may have a substantially uniform thickness; however, exemplary embodiments of the present invention are not limited thereto. As an example, the organic material layer 160 may have a different thickness depending on locations such that the organic material layer 160 may have the top surface thereof with a gradual curve slope near the inside surface of the opening 110a of the buffer layer 110, the inside surface of the opening 120a of the gate insulating layer 120, or the inside surface of the opening 130a of the interlayer insulating layer 130.

The display apparatus according to an exemplary embodiment of the present invention may employ the flexible substrate 100 having the first barrier region 103 and thus, outside air, moisture and oxygen which can infiltrate from below the flexible substrate 100 may be reduced or prevented from infiltrating into the inside of the display area. The first barrier region 103 of the flexible substrate 100 may be on the neutral plane NP of the flexible substrate 100 and thus, when the flexible substrate 100 is bent in the bending area BA, a crack occurrence in the first barrier region 103 may be reduced or prevented.

It should be understood that embodiments described herein should be considered in a descriptive sense and not for purposes of limitation. Descriptions of features or aspects within each embodiment should typically be considered as available for other similar features or aspects in other embodiments.

While one or more embodiments have been described with reference to the figures, it will be understood by one of ordinary skill in the art that various changes in form and details may be made therein without departing from the spirit and scope of the present invention.

What is claimed is:

1. A flexible substrate comprising:
   a polymer substrate;
   a first barrier region, wherein at least a portion of the first barrier region is formed on a neutral plane of the polymer substrate;
   a top region formed above the first barrier region; and
   a bottom region formed below the first barrier region,
   wherein the first barrier region comprises a first inorganic material disposed in at least a portion of a free volume of the polymer substrate, and
   wherein a density of the first inorganic material in the first barrier region is greater than a density of the first inorganic material in the top or bottom regions.

2. The flexible substrate of claim 1, wherein the density of the first inorganic material in the first barrier region gradually decreases from a center thickness of the first barrier region toward upper and lower surfaces of the polymer substrate.

3. The flexible substrate of claim 1, wherein the first, inorganic material comprises at least one of silicon nitride, aluminum nitride, zirconium nitride, titanium nitride, hafnium nitride, tantalum nitride, silicon oxide, aluminum oxide, titanium oxide, tin oxide, serium oxide, or silicon oxynitride (SiON).

4. The flexible stubstrate of claim.1, wherein the first inorganic material of the first barrier region tills from about 0.1% to about 50% of a free volume of the first barrier region, and wherein an average thickness of the first barrier region is equal to or less than from about 5% to about 50% of a thickness of the, polymer substrate.

5. The flexible substrate of claim 1, wherein a position of a basic core of the first barrier region does not coincide with a position of the neutral plane.

6. The flexible substrate of claim 1, wherein a thickness of the polymer substrate is from about 10 μm to about 100 μm, and wherein an average thickness of the first barrier region is from about 50 nm to about 50 μm.

7. The flexible substrate of claim 1, further comprising a second barrier region in at least one of the top and bottom regions,
   wherein the second barrier region comprises a second inorganic material disposed in at least a portion of the free volume of the polymer substrate, and wherein a volume of the second barrier region is less than the volume of the first barrier region.

8. The flexible substrate of claim 7, wherein the second inorganic material is the same as the first inorganic material.

9. The flexible substrate of claim 1, wherein a hardness of the first barrier region is greater than a hardness of the top and bottom regions.

10. A display apparatus comprising:
    a flexible substrate including a display area and a non-display area;
    a display device in the display area and a thin film transistor connected to the display device; and
    an encapsulation layer configured to encapsulate the display area,
    wherein the flexible substrate comprises:
    a polymer substrate;
    a first barrier region, wherein at least a portion of the first barrier region is formed on a neutral plane of the polymer substrate;
    a top region formed above the first barrier region; and
    a bottom region formed below the first barrier region,
    wherein the first barrier region comprises a first inorganic material disposed in at least a portion of a free volume of the polymer substrate, and
    wherein a density of the first inorganic material in the first barrier region is greater than a density of the first inorganic material in the top or bottom regions.

11. The display apparatus of claim 10, wherein the non-display area of the flexible substrate comprises a bending area bent around a bending axis, the display apparatus further comprising:
    a fan-out wire, wherein at breast a portion of the fan-out area is in the bending area; and
    an organic material layer, wherein at least a portion of the organic material layer is between the fan-out wire and the flexible substrate in the bending area.

12. The display apparatus of claim 11, further comprising an inorganic insulating layer on the flexible substrate, the inorganic insulating layer having an opening corresponding to the bending area,
    wherein the organic material layer fills at least a portion of the opening.

13. The display apparatus of claim 10, wherein the display device is an organic light-emitting diode comprising a pixel electrode, a counter electrode facing the pixel electrode, and an intermediate layer including an organic light-emitting layer between the pixel electrode ante the counter electrode.

14. The display apparatus of claim 10, wherein a density of the first inorganic material, in the first harrier region gradually decreases from a center thickness of the first barrier region toward upper and lower ends of the flexible substrate.

15. The display apparatus of claim 10, wherein a thickness of the top region is different from a thickness of the bottom region.

16. The display apparatus of claim 10, further comprising a second barrier region in at least one of the top and bottom regions,
    wherein the second barrier region comprises a second inorganic material disposed in at least a portion of the free volume of the polymer substrate, and wherein a volume of the second barrier region is less than a volume of the first barrier region.

17. A polymer substrate, comprising:
a bottom region;
a top region; and
a first barrier region formed between the bottom region and the top region, wherein the first barrier region comprises a first inorganic material disposed in at least a portion of a free volume of the polymer substrate,
wherein a density of the first barrier region is greater than densities of the bottom region and the top region, and
wherein densities of bottom region, the first barrier region and the top region gradually decreases from the first barrier region toward a lower surface of the bottom region and an upper surface of the top region.

18. The polymer substrate of claim 17, further comprising a second barrier region in at least one of the top and bottom regions.

* * * * *